(12) United States Patent
Chen et al.

(10) Patent No.: US 12,308,266 B2
(45) Date of Patent: May 20, 2025

(54) SEMICONDUCTOR SUBSTRATE BOAT AND METHODS OF USING THE SAME

(71) Applicant: Taiwan Semiconductor Manufacturing Co., Ltd., Hsinchu (TW)

(72) Inventors: Tung-Huang Chen, Hsinchu (TW); Chi-Hao Kung, Hsinchu (TW); Yen-Yu Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 1000 days.

(21) Appl. No.: 17/039,356

(22) Filed: Sep. 30, 2020

(65) Prior Publication Data

US 2022/0102175 A1    Mar. 31, 2022

(51) Int. Cl.
| | |
|---|---|
| H01L 21/673 | (2006.01) |
| H01L 21/324 | (2006.01) |
| H01L 21/67 | (2006.01) |
| H01L 21/687 | (2006.01) |

(52) U.S. Cl.
CPC ...... *H01L 21/67323* (2013.01); *H01L 21/324* (2013.01); *H01L 21/67098* (2013.01); *H01L 21/67309* (2013.01); *H01L 21/6875* (2013.01)

(58) Field of Classification Search
USPC ................ 118/725, 728, 500, 503
See application file for complete search history.

(56) References Cited

U.S. PATENT DOCUMENTS

| | | |
|---|---|---|
| 7,033,168 B1 | 4/2006 | Gupta et al. |
| 8,168,269 B2 | 5/2012 | Mahajani et al. |
| 9,991,139 B2 | 6/2018 | Oosterlaken et al. |
| 10,008,402 B1 | 6/2018 | Ogitsu |
| 10,026,633 B2 | 7/2018 | Ogitsu |
| 2009/0004405 A1* | 1/2009 | Merry ................. C23C 16/4586 |
| | | 118/724 |

FOREIGN PATENT DOCUMENTS

| | | | |
|---|---|---|---|
| JP | 4896260 B2 * | 3/2012 | ....... H01L 21/67383 |
| TW | 201709383 A | 3/2017 | |
| WO | WO 2009107254 A1 | 9/2009 | |
| WO | WO-2011109535 A2 * | 9/2011 | ....... H01L 21/67057 |

OTHER PUBLICATIONS

English Translation JP4896260 B2 (Year: 2012).*
English Translation WO-2011109535A2 (Year: 2011).*

* cited by examiner

*Primary Examiner* — Yewebdar T Tadesse
(74) *Attorney, Agent, or Firm* — Seed IP Law Group LLP

(57) ABSTRACT

A substrate boat for use in heat treatment of semiconductor wafers includes support rods and fingers for supporting a substrate in a horizontal orientation in process tools, e.g., furnaces. The substrate is supported in the substrate boat by groups of fingers lying in a common horizontal plane. The fingers contact the substrate at support locations on the back side of the substrate. The fingers have a plurality of different shapes and a substrate surface no contact region.

20 Claims, 5 Drawing Sheets

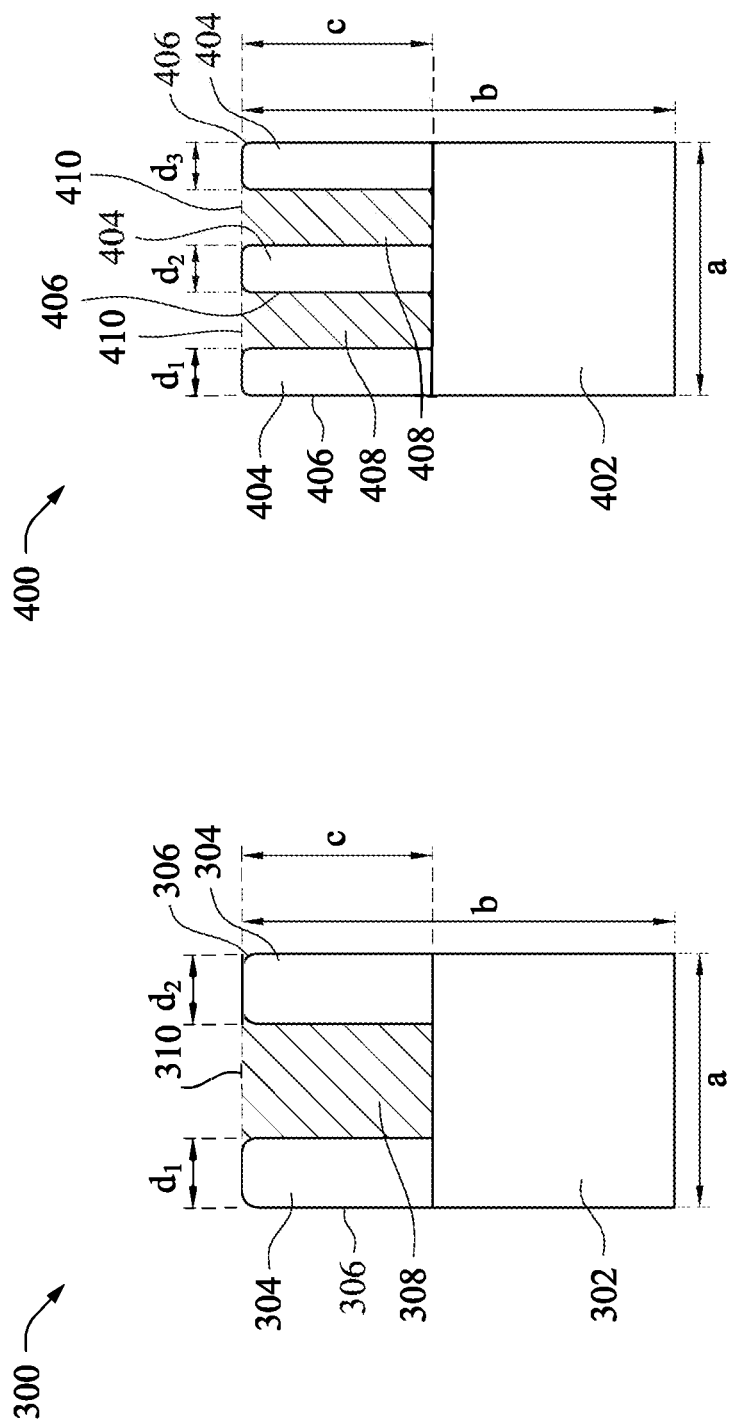

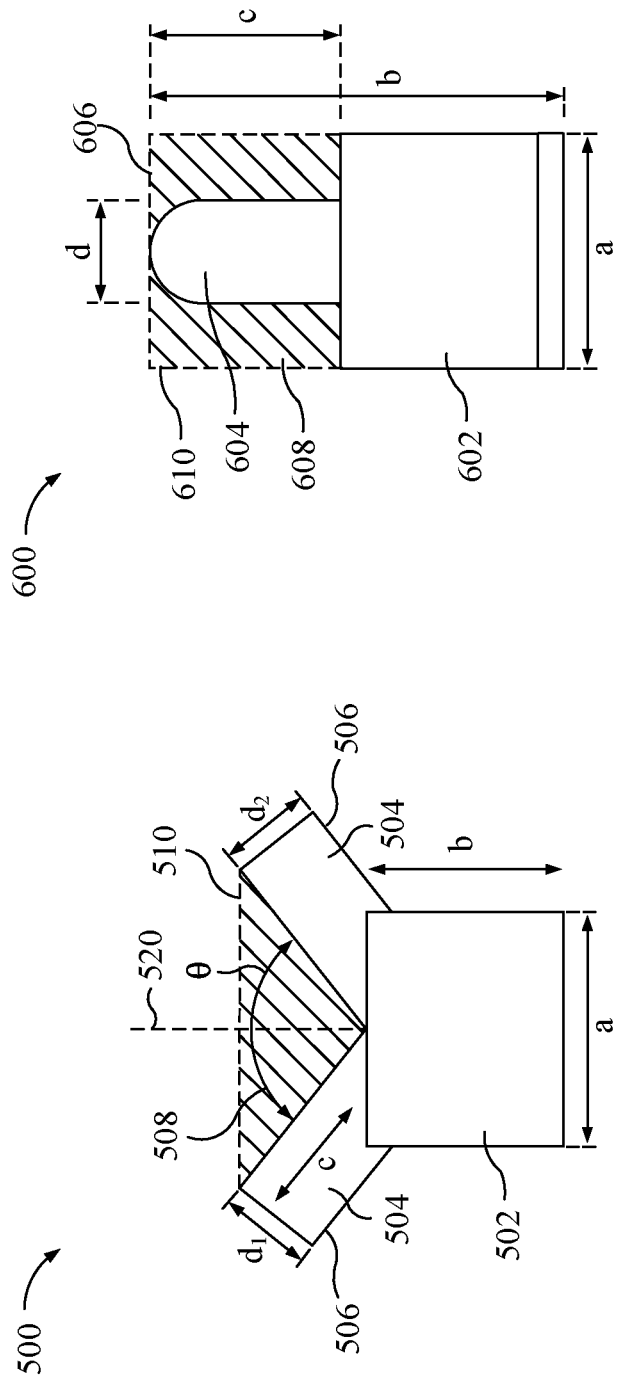

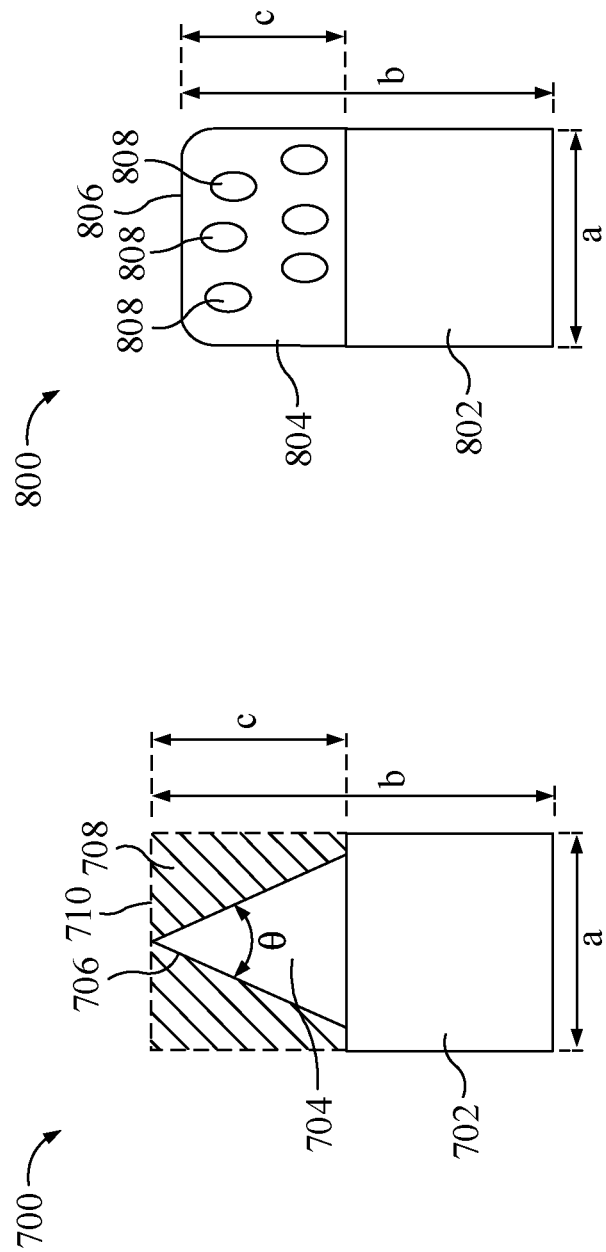

SEMICONDUCTOR SUBSTRATE BOAT AND METHODS OF USING THE SAME

BACKGROUND

High temperature heat-treatment (annealing) of semiconductor wafers is commonly used to achieve certain desirable characteristics. For example, such a process may be used to create a defect free layer of silicon on the wafers or form a silicon nitride film. Such high temperature processes are typically carried out in a vertical furnace which subjects the wafers to elevated temperatures.

During such high temperature heat-treatment, the wafers should be adequately supported to avoid slip or deformation due to local gravitational and thermal stresses. In some processes, vertical wafer boats are used to adequately support semiconductor wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a top plan view of a boat finger in accordance with an embodiment of the present disclosure.

FIG. 4 is a top plan view of a boat finger in accordance with an embodiment of the present disclosure.

FIG. 5 is a top plan view of a boat finger in accordance with an embodiment of the present disclosure.

FIG. 6 is a top plan view of a boat finger in accordance with an embodiment of the present disclosure.

FIG. 7 is a top plan view of a boat finger in accordance with an embodiment of the present disclosure.

FIG. 8 is a top plan view of a boat finger in accordance with an embodiment of the present disclosure.

DETAILED DESCRIPTION

Figure 1:
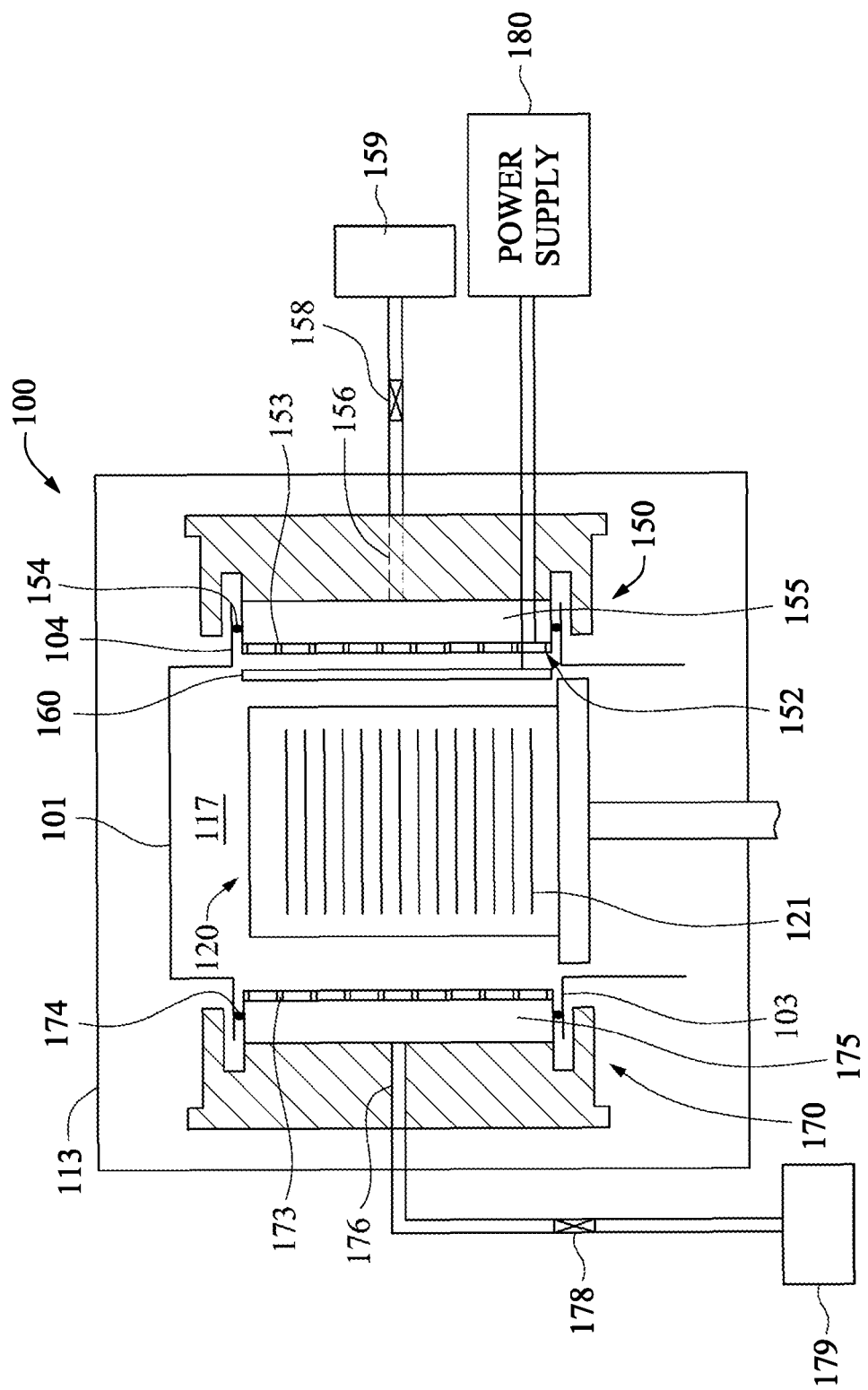
FIG. 1 is a cross-sectional view of a process chamber including a wafer boat in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One embodiment described herein is a method for processing a substrate that includes supporting a substrate having a front side in a backside in a substrate boat. The substrate boat includes a top plate, a bottom plate and a plurality of boat rods extending between the top plate in the bottom plate. Each of the plurality of boat rods includes a finger that includes an underside, a substrate contact surface and a substrate no contact region. The substrate contact surface contacts an underside of a substrate supported by the substrate boat. The substrate no contact region is overlapped by the substrate located in the substrate boat. In one embodiment, a surface area of the substrate contact surface is less than the sum of an area of the substrate no contact region and the surface area of the substrate contact surface. The method further includes a step of forming a film on the backside of the substrate and patterning a front side of the substrate. In accordance with some embodiments of the present disclosure, contact of the finger and the backside of the substrate does not cause the thickness of the film formed on the backside of the substrate to be so thin that when the substrate is subjected to subsequent patterning of the front side of the substrate the "boat print" formed on the backside of the substrate (due to the contact between the finger and the underside of the substrate) causes anomalies to form in the front side surface of the substrate due to forces exerted on the backside of the substrate during the subsequent patterning process. Other embodiments of the present disclosure relate to a substrate boat including boat fingers as described herein and a thermal processing system including a substrate boat including fingers as described herein.

Generally, excited species of processing gases may be generated to assist an atomic layer deposition (ALD) process as described herein. These species may be excited by plasma assistance, UV assistance (photo assistance), ion assistance (e.g., ions generated by an ion source), or combinations thereof. The species are excited in or in the vicinity of the process region within the chamber housing to avoid relaxation of the excited states before the ions reach the process region of the batch processing chamber. An embodiment of the present disclosure is described in the context of an ALD process carried out in a furnace; however, the present disclosure is not limited to an embodiment that carries out an ALD process in a furnace. Embodiments of the present disclosure include other material deposition processes or heat treatment process that are carried out in a furnace and utilize a substrate, e.g., wafer, boat to support an underside of the substrates within the furnace during the deposition process which deposits material on the underside of the substrate or a thermal treatment process.

A "substrate" as referred to herein, includes, but is not limited to, semiconductor wafers, semiconductor workpieces, and other workpieces such as optical planks, memory disks and the like. Embodiments of the invention may be applied to any generally flat workpiece on which material is deposited by the methods described herein and utilizing the devices described herein.

"Vertical direction" and "horizontal direction" are to be understood as indicating relative directions. Thus, the horizontal direction is to be understood as substantially perpendicular to the vertical direction and vice versa. Nevertheless, it is within the scope of the present disclosure that the described embodiments and aspects may be rotated in its entirety such that the dimension referred to as the vertical direction is oriented horizontally and, at the same time, the dimension referred to as the horizontal direction is oriented vertically.

A batch processing chamber for ALD processing useful with embodiments described herein includes a chamber, a heating system, a gas delivery system, and an exhaust system. FIG. 1 illustrates one embodiment of a batch processing chamber having an inner chamber 101 (e.g., a quartz chamber), and controlled inject assembly 150 and exhaust assembly 170 in fluid communication with the inner chamber 101. In some embodiments, the inject assembly 150 and the exhaust assembly 170 are temperature controlled to avoid condensation of processing gases. FIG. 1 is a sectional side view of a batch processing chamber 100. The batch processing chamber 100 generally contains an inner chamber 101 defining a process region 117 configured to accommodate a batch of substrates 121 stacked in a substrate boat 120. The substrates are provided in the process region to be processed by various deposition processes, such as an ALD process. Generally, one or more heater blocks (not shown) are arranged around the inner chamber 101 and are configured to heat the substrates 121 provided in the process region 117. In one embodiment, the inner chamber 101 may, for example, be a quartz chamber. An outer chamber 113 is generally disposed around the inner chamber 101. One or more thermal insulators (not shown) may be provided between the outer chamber 113 and any heaters in order to keep the outer chamber cool.

FIG. 1 shows the inner chamber 101, e.g., a quartz chamber, generally containing a chamber body having an opening on the bottom, an injector pocket formed on one side of the chamber body, an exhaust pocket formed on the chamber body on an opposite side of the injector pocket. The inner chamber 101 has a cylindrical shape similar to that of the substrate boat 120. Thereby, the process region 117 may be kept small. A reduced process region reduces the amount of processing gas per batch and shortens residence time during batch processing.

In one embodiment, the exhaust pocket 103 and the injector pocket 104 may be welded in place with slots milled on the chamber body of inner chamber 101. According to one embodiment, the injector pocket and the exhaust pocket are flattened quartz tubing with one end welded on the chamber body and one end open. The injector pocket 104 and the exhaust pocket 103 are configured to house injector assembly 150 and exhaust assembly 170. In some embodiments, injector assembly 150 and exhaust assembly 170 are temperature controlled. Further, a support plate for supporting the inner (quartz) chamber is further connected to a load lock positioned below the bottom opening of inner chamber 101. The substrate boat 120 may be loaded and unloaded through the load lock. The substrate boat 120 may be vertically translated between the process region 117 and the load lock via the opening at the bottom of the inner chamber. Details of various embodiments of substrate boat 120 are described below in more detail.

The heater blocks are generally wrapped around an outer periphery of the inner chamber 101 except near the injector pocket 104 and the exhaust pocket 103. According to another embodiment (not shown) the heater blocks (not shown) may also be wrapped around the injector pocket 104 and/or the exhaust pocket 103. The substrates 121 are heated to an appropriate temperature by the heater blocks through the inner chamber 101. The heaters are controlled to achieve uniform heating of the substrates. In one embodiment, points on the substrates 121 in a batch process attain the same set point temperature plus or minus 1 degree Celsius. Configurations of the batch processing chamber 100 improve temperature uniformity in batch processing. For example, a cylindrical shape of the inner chamber 101 results in edges of the substrates 121 evenly distanced from the inner chamber. Also, the heaters may have multiple controllable zones to adjust variations of temperature between regions. The heater blocks may be made of resistive heaters arranged in multiple vertical zones. In one example, the heater blocks may be ceramic resistive heaters.

FIG. 1 illustrates that the injector pocket 104 may be welded on a side of the chamber body defining an inject volume in communication with the process region 117. The inject volume typically extends along the entire height of the substrate boat 120 when the substrate boat is in a process position. The injector assembly 150 disposed in the injector pocket may, thus, provide a horizontal flow of processing gases to every substrate 121 within substrate boat 120.

A recess is formed to hold walls of the injector pocket 104. The injector assembly is thermally isolated, e.g., by seal 154. Seal 154, which may be an o-ring or other suitable elements, also provide a vacuum seal to control the pressure in the inner chamber 101. Thermal isolation of the injector assembly may be desired to independently control the temperature of the injector. Since the process region 117 and the injector volume are usually kept in a vacuum state during process, an outer volume between inner chamber 101 and chamber 113 may also be evacuated. Keeping the outer volume under a reduced pressure may reduce pressure generated stress on inner chamber 101. Additional vacuum seals, such as o-rings, may be disposed between appropriate parts of chamber 100, in order to control the pressure of the process region 117, the vacuum/pressure stress applied to inner chamber 101, to control gas flow of inserted processing gases only towards the process region. Further, one or more vacuum pumps may be directly or via additional exhaust plenums (not shown) connected to the inner chamber in order to control the pressure in the inner chamber 101.

The temperature of various components in a batch processing chamber may be independently controllable, especially when a deposition process is to be performed in the batch processing chamber. If the temperature of the injector assembly is too low, the gas injected may condense and remain on the surface of the injector assembly, which can generate particles and affect the chamber process. If the temperature of the injector assembly is high enough to evoke gas phase decomposition and/or surface decomposition, paths in the injector assembly may become clogged. In some embodiments, an injector assembly of a batch processing chamber is heated to a temperature lower than a decomposition temperature of a gas being injected and higher than a condensation temperature of the gas. The temperature of the injector assembly is generally different than the processing temperature in the process region. In one example, substrates may be heated up to about 600 degrees Celsius, while the temperature of the injector assembly is about 80 degrees Celsius during an atomic layer deposition process. Therefore, the temperature of the injector assembly is controlled independently.

FIG. 1 illustrates that the exhaust pocket 103 may be welded on a side of the chamber body defining an exhaust volume in communication with the process region 117. The exhaust volume typically covers an entire height of the substrate boat 120 when the substrate boat is in a process position such that the exhaust assembly 170 disposed in the exhaust pocket may provide a horizontal flow of processing gases to every substrate 121. A recess is formed to hold walls of the exhaust pocket 103. The exhaust assembly is thermally isolated, e.g., by seal 174. Seal 174, which may be an o-ring or other suitable elements, also provide a vacuum seal to be able to control the pressure in the inner chamber 101. Thermal isolation of the exhaust assembly may be desired to independently control the temperature of the exhaust.

Since the process region 117 and the exhaust volume are usually kept in a vacuum state during process, an outer volume between inner chamber 101 and chamber 113 may also be evacuated. Keeping the outer volume vacuumed can reduce pressure generated stress on the inner chamber 101. Additional vacuum seals, such as o-rings, may be disposed between appropriate parts of chamber 100, in order to control the pressure of the process region 117, the vacuum/pressure stress applied to inner chamber 101 and/or to control gas flow of inserted processing gases only towards the process region. Further, one or more vacuum pumps may be directly or via additional exhaust plenums (not shown) connected to the inner chamber in order to control the pressure in the inner chamber 101.

Temperature of various components in a batch processing chamber may be controlled independently, especially when a deposition process is to be performed in the batch processing chamber. On the one hand, it is desirable to keep the temperature in the exhaust assembly lower than the temperature in the processing chamber such that the deposition reactions do not occur in the exhaust assembly. On the other hand, it is desirable to heat an exhaust assembly such that processing gases passing the exhaust assembly do not condense and remain on the surface causing particle contamination. If deposition of reaction byproducts on the exhaust assembly does occur, then elevated temperatures on the exhaust assembly may mitigate against the deposition of byproducts that adhere strongly to components of the exhaust assembly. Therefore, the exhaust assembly may be heated independently from the process region.

FIG. 1 illustrates that additionally a gas source 159 is provided. The gas source 159 provides processing gas, like precursor gases or deposition gases, treatment gases, carrier gases, and purge gases via valve 158 and via inlet channel 156 into the vertical channel 155 of the injector assembly. The vertical channel 155 may also be denoted as plenum 155 or cavity 155. The processing gas enters the process region 117 through openings 153 of the injector assembly. The plate and openings form a faceplate 152 to have a uniform distribution of the gas over the substrates 121 in the substrate boat 120.

Generally, carrier gases and purge gases, which may be used as a processing gas, include $N_2$, $H_2$, Ar, He, combinations thereof, and the like. During pretreatment steps $H_2$, $NH_3$, $B_2H_6$, $Si_2H_4$, $SiH_6$, $H_2O$, HF, HCl, $O_2$, $O_3$ or other known gases may be used as a processing gas. In one embodiment, deposition gases or precursor gases may contain a nitrogen precursor, a hafnium precursor, a silicon precursor or a combination thereof.

Even though FIG. 1 shows only one gas source, in other embodiments, it will be appreciated that a plurality of gas sources, for example, one gas source for a first precursor, one gas source for a second precursor, and one gas source for a carrier and purge gas, may be coupled to the batch processing chamber 100. A gas flow from the different gases may be switched on or off according to the desired needs for a process. Thereby, 3- or 4-way valves may be used to provide the different gases to the inlet channel 156. Alternatively, two, three, or more inlet channels 156 may milled horizontally across the inject assembly 150 and several vertical channels 155 may be provided to insert different processing gases in the process region.

On the opposite end of inner chamber 101 from injector assembly 150 an exhaust pocket 103 is provided in chamber 101. Exhaust pocket receives exhaust assembly 170. An exhaust port 176 is formed horizontally across the exhaust assembly 170 near a center portion. The exhaust port 176 opens to a vertical compartment 175 formed in the center portion. The vertical compartment 175 is further connected to a plurality of horizontal slots 173 which are open to the process region 117. When the process region 117 is being pumped out with vacuum pump 179 via valve 178, processing gases first flow from the process region 117 to the vertical compartment 175 through the plurality of horizontal slots 173. The processing gases then flow into an exhaust system via the exhaust port 176. In one aspect, the horizontal slots 173 may vary in size depending on the distance between a specific horizontal slot 173 and the exhaust port 176 to provide an even draw across the substrate boat 120 from top to bottom.

Processing gases such as precursor gases, deposition gases, treatment gases, purge or carrier gases, as described in more detail above, are delivered to and from process region 117 by injector assembly and exhaust assembly. A uniform gas flow across each substrate 121 as well as a uniform gas flow across all substrates vertically aligned in the substrate boat 120 is desired.

The gas flow carries ionized species of the processing gases, like precursor gases or carrier or purge gases. The uniformity of the gas flow also improves the uniformity of the ionized species, which are used to provide plasma assisted, UV assisted, or ion assisted processes. Generally, the process assistance by plasma, UV, ion generation can be characterized as exciting the introduced gas or by ionizing the introduced gases. The components providing the processing gas flow to the process region 117 are configured to form a uniformly deposited material across each substrate and across the substrates in the substrate boat.

The described embodiment provides an apparatus and a method for processing semiconductor substrates in a batch tool.

An embodiment illustrated in FIG. 1 includes a power source 180 to generate a plasma, which is connected to the diffuser 160 and the faceplate 152 of the injector assembly 150. A plasma is generated between the diffuser 160 and the faceplate 152 of the injector assembly 150. The injector face is used as an anode and the diffuser is used as a cathode to generate a plasma therebetween. The power applied to generate the plasma can be adapted to the desired application and may depend on the energy necessary to ionize particular species in the processing gas flowing into the process region. As a result, the plasma power may vary depending on the process step presently conducted. For example, for a plasma assisted ALD process, a different power may be applied during a gas flow of a first precursor, during purging or pumping to remove the first precursor, during gas flow of a second precursor and during purging or pumping to remove the second precursor. Alternatively, some of the process steps may be conducted at similar plasma power or without plasma assistance. For example the purge steps may be conducted with the same power or without power, whereas for the times when precursors are provided to the process region, plasma power adapted for the first and second precursor, respectively, is applied.

As already mentioned above, barrier seal 154 is disposed between the inject pocket 104 and the inject assembly 150, and barrier seal 174 is disposed between the exhaust pocket 103 and the exhaust assembly 170. Thereby, processing chemicals are prevented from entering any undesirable areas in the batch processing chamber. Further, a vacuum seal for the quartz chamber may be provided by seals 154, 174. Additionally, the seals, which may be provided in the form of O-rings or the like, can electrically insulate different components within the chamber from each other. This is of increasing relevance as the power provided by power supply 180 increases. Higher voltages applied to electrodes, e.g., the injector assembly, may require improved electrical insulation of the injector assembly.

Within an embodiment shown in FIG. 1, the plasma may be confined between the face of the injector assembly 150 and the diffuser 160. Thereby, direct exposure of the substrate to a plasma may be avoided. In some embodiments, this will be desirable to prevent plasma damage to the surfaces of the substrates. Accordingly, the diffuser shields the substrates from the plasma. In the embodiments described while making reference to FIG. 1, a plasma is generated in the horizontal direction. The plasma extends along the vertical direction of the diffuser 160 and the injector assembly 150. Thus, the horizontal plasma extends along the vertical direction of the process region 117. The substrates 121 in the substrate boat 120 are exposed to the plasma along the entire stack of substrates. The previously described uniform gas flow provides a uniform distribution of ionized species of the plasma across the wafers.

Figure 2:
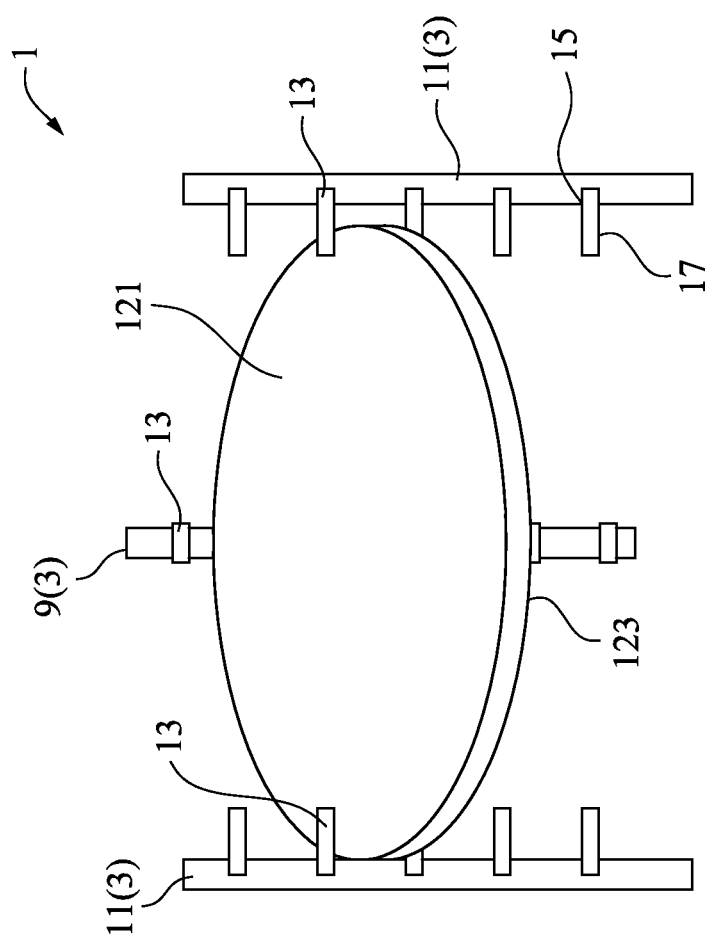
FIG. 2 is a schematic perspective view of portion of a wafer boat in accordance with an embodiment of the present disclosure.

FIG. 2 illustrates a portion of an embodiment of a substrate wafer boat, in accordance with the present disclosure, indicated generally at 1. The substrate boat 1 includes spaced-apart support rods 3 (boat rods) that are affixed at their top to a top plate (not shown) and at their base to a bottom plate (not shown) of the boat to retain the positions of the rods relative to each other. When the wafer boat 1 is placed in a vertical process chamber, such as a furnace, the support rods 3 are generally vertical. In the illustrated embodiment, the wafer boat 1 has a central rod 9 and two forward rods 11.

The support rods 3 support a plurality of laterally extending boat fingers 13. The fingers 13 may be integrally formed on the support rods 3. Alternatively, cuts or slots may be made in an elongate one-piece structure of the rods 3, forming a slot for receiving fingers 13 and securing them to support rods 3. Each finger includes a top side upon which in underside of the substrate 121 rests when placed within boat 1 and an underside 17 opposite front side 15. The fingers 13 of the substrate boat 1 are arranged in groups lying in different common generally horizontal planes along the vertical length of the support rods 3. The fingers 13 that lie in a same generally horizontal plane engage and support a same substrate 121. The fingers 13 that lie in a same generally horizontal plane contact a backside 123 of substrate 121. The entire substrate boat 1 is made of quartz, a silicon carbide material, or other suitable material that is mechanically stable and chemically inert with respect to the processing conditions to which it will be exposed, including high temperatures.

In use, the substrate boat 1 is readied by placing substrates, e.g., wafers, into the boat 1 so that each wafer is placed on the top surface of three boat fingers that lie in the same horizontal plane. The wafers can be loaded into the boat via a robotic arm. Once the boat 1 is loaded with a predetermined number of wafers, the boat is received in the process chamber where a high-temperature heat treatment is performed. After heat treatment and other treatment, the wafers are unloaded from the boat 1, e.g., using a robotic arm.

When the high temperature heat treatment involves depositing or forming a film (e.g., $SiO_2$ or SiN) on the backside of the substrate, the thickness of the film on the back side of the substrate at the location where the boat fingers contact the backside of the substrate can be less than the thickness of the film at other locations on the backside of the substrate. Without being bound to any theory, the lesser thickness of the film at the location where the boat fingers contact the backside of the substrate (sometime referred to as "boat print") is a result of reduced reaction of the substrate with gas within the chamber and/or a lower temperature of the substrate at the location where the boat fingers contact the backside of the substrate. These areas of reduced thickness of the film on the backside of the substrate can negatively impact subsequent patterning, e.g., photolithographic patterning, of films or layers on the front side of the substrate, especially in areas on the front side of the substrate that overlap the areas on the backside of the substrate which include films of reduced thickness. For example, photolithographic patterning of films or layers on the front side of the substrate involves securing the backside of the substrate to an electrostatic chuck. Forces exerted by the electrostatic chuck on the back side of the substrate can cause the substrate and layers or films on the front side of the substrate that overlap the areas of reduced film thickness on the backside of the substrate to deform, causing local deformation at the front side surface of the substrate. For example, such local deformations can produce depressions or other surface anomalies which cause the surface of the front side of the substrate to not to be planar. When the surface of the front side of the substrate is not planar, the focus of the photolithographic tool is compromised which will result in less precise patterning of features on the front side surface of the substrate. These negative impacts of the boat prints on the backside of the substrate are exacerbated when a device includes multiple layers of films that are deposited or formed as described above.

In accordance with an embodiment of the present disclosure, a substrate boat finger is described which includes an underside surface, a substrate contact surface and a substrate no contact region. A substrate boat finger in accordance with an embodiment of the present disclosure includes a substrate contact surface having a surface area that is less than a sum of an area of the substrate no contact region and the surface area of the substrate contact region. The presence of the substrate no contact region within the boat finger reduces the area over which the finger contacts the underside of the substrate. Reducing the area over which the boat finger contacts the backside of the substrate reduces the impact of the boat to print on subsequent processes carried out on the front side of the substrate.

Referring to FIG. 3, a top plan view of a boat finger 300 in accordance with an embodiment of the present disclosure is illustrated. Boat finger 300 includes a topside surface (15 in FIG. 2) and an underside surface (17 in FIG. 2). In FIG. 3, finger 300 includes a width "a" and a length "b". Topside surface in FIG. 3 includes a substrate no contact surface 302, two substrate contact surfaces 304 and a substrate no contact region 308. Substrate no contact surface 302 corresponds to those portions on the finger 300 that do not contact an underside of substrate 121 (see FIG. 2). In FIG. 3, the substrate no contact surface 302 has a width "a" and a length equal to the difference between "b" and "c" (length of substrate contact surface 304). Boat finger 300 in FIG. 3 further includes two rectangular in shape, substrate contact sub-fingers 306 which each include rectangular in shape, substrate contact surfaces 304 on their topsides. Substrate contact sub-fingers 306 extend away from boat rods (3 in FIG. 2) and substrate no contact surface 302 towards the center of a supported substrate (not shown in FIG. 3). In FIG. 3, the corners of substrate contact sub-fingers 306 at their distal ends are square, but in other embodiments, the corners are rounded or beveled. Substrate contact sub-fingers 306 have a width "d" and a length "c" defining contact surface area of each substrate contact sub-finger 306. Boat finger 300 further includes a substrate no contact region 308 between the two substrate contact sub-fingers 306. The substrate no contact region 308 is a void space between the two substrate contact sub-fingers 306 and is further bounded by the broken line 310 in FIG. 3. Substrate no contact region 308 has a width equal to "a" minus 2"d" and a length "c". The area of substrate no contact region 308 is defined by its width and its length. In accordance with the embodiment of FIG. 3, the combined surface area of the two substrate contact surfaces 304 is less than a sum of the area of the substrate no contact region 308 and the combined surface area of the two substrate contact surfaces 304.

Referring to FIG. 4, a top plan view of a boat finger 400 in accordance with an embodiment of the present disclosure is illustrated. Boat finger 400 includes a topside surface (15 in FIG. 2) and an underside surface (17 in FIG. 2). In FIG. 4, finger 400 includes a width "a" and a length "b". Topside surface in FIG. 4 includes a substrate no contact surface 402, three substrate contact surfaces 404 and two substrate no contact regions 408. Substrate no contact surface 402 corresponds to those portions on the finger 400 that do not contact an underside of substrate 121 (see FIG. 2). In FIG. 4, the substrate no contact surface 402 has a width "a" and a length equal to the difference between "b" and "c" (length of substrate contact surface 404). Boat finger 400 in FIG. 4 further includes three rectangular in shape, substrate contact sub-fingers 406 which each include rectangular in shape, substrate contact surfaces 404 on their topsides. Substrate contact sub-fingers 406 extend away from boat rods (3 in FIG. 2) and substrate no contact surface 402 towards the center of a supported substrate (not shown in FIG. 3). In FIG. 4, the corners of substrate contact sub-fingers 406 at their distal end are square, but in other embodiments, the corners are rounded or beveled. Substrate contact sub-fingers 406 have a width "d" and a length "c" defining a contact surface area of each substrate contact sub-finger 406. Boat finger 400 further includes a substrate no contact region 408 between the three substrate contact sub-fingers 406. The substrate no contact region 408 is a void space between the three substrate contact sub-fingers 406 and is further bounded by the broken lines 410 in FIG. 43. Each substrate no contact region 408 has a width. In FIG. 4, the sum of the widths of the two substrate no-contact regions 408 is equal to "a" minus 3"d". The substrate no-contact regions have a length "c". The combined area of the two substrate no contact regions 408 is defined by the sum of the widths of the two substrate no-contact regions 408 times their length. In accordance with the embodiment of FIG. 4, the combined surface area of the two substrate contact surfaces 404 is less than a sum of the area of the two substrate no contact regions 408 and the combined surface area of the three substrate contact surfaces 404. While the embodiment of FIG. 2 illustrates a boat finger including two substrate contact sub-fingers 306 and one substrate no contact region 308 and FIG. 3 illustrates a boat finger including three substrate contact sub-fingers 406 and two substrate no contact regions 408, embodiments in accordance with the present disclosure include boat fingers that include a larger number of substrate contact sub-fingers and a larger number of substrate no contact regions. In addition, the substrate contact sub-fingers in FIGS. 3 and 4 are illustrated as having a substantially rectangular shape. In other embodiments, the two, three or more substrate contact sub-fingers have a shape that is not rectangular or non-rectangular, e.g., triangular, arcuate or polygonal.

Referring to FIG. 5, a top plan view of a boat finger 500 in accordance with an embodiment of the present disclosure is illustrated. Boat finger 500 includes a topside surface (15 in FIG. 2) and an underside surface (17 in FIG. 2). Topside surface in FIG. 5 includes a substrate no contact surface 502, two substrate contact surfaces 504 and one substrate no contact region 508. Substrate no contact surface 502 corresponds to those portions on the finger 500 that do not contact an underside of substrate 121 (see FIG. 2). In FIG. 5, the substrate no contact surface 502 has a width "a" and a length "b". Boat finger 500 in FIG. 5 further includes two partially rectangular in shape, substrate contact sub-fingers 506 which each include partially rectangular in shape, substrate contact surfaces 504 on their topsides. Substrate contact sub-fingers 506 extend away from boat rods (3 in FIG. 2) and substrate no contact surface 502 at an angle Θ relative to radial line 520 passing through a vertical axial centerline of boat (1 in FIG. 2) and biasing in half the substrate no-contact surface 502. In FIG. 5, the corners of substrate contact sub-fingers 506 at their distal end are square, but in other embodiments, the corners are rounded or beveled. Substrate contact sub-fingers 506 have a width "d" and a length "c" from which a contact surface area of each substrate contact sub-finger 506 can be calculated depending on the value of Θ. Boat finger 500 further includes a substrate no contact region 508 between the two substrate contact sub-fingers 506. The substrate no contact region 508 is a void space between the two substrate contact sub-fingers 506 and is further bounded by the broken lines 510 in FIG. 43. The area of the substrate no contact region 508 can be determined based on "c" and the angle Θ. In accordance with the embodiment of FIG. 5, the combined surface area of the two substrate contact surfaces 504 is less than a sum of the area of the substrate no contact region 508 and the combined surface area of the two substrate contact surfaces 504.

Referring to FIG. 6, a top plan view of a boat finger 600 in accordance with an embodiment of the present disclosure is illustrated. Boat finger 600 includes a topside surface (15 in FIG. 2) and an underside surface (17 in FIG. 2). In FIG. 6, finger 600 includes a width "a" and a length "b". Topside surface in FIG. 6 includes a substrate no contact surface 602, a substrate contact surface 604 and a substrate no contact region 608. Substrate no contact surface 602 corresponds to those portions on the finger 600 that do not contact an underside of substrate 121 (see FIG. 2). In FIG. 6, the substrate no contact surface 602 has a width "a" and a length equal to the difference between "b" and "c" (length of substrate contact surface 604). Boat finger 600 in FIG. 6 further includes a substrate contact sub-finger 606 which includes rectangular body with an arcuate distal end that also includes a similarly shaped substrate contact surface 604 on its topside. Substrate contact sub-finger 606 extends away from boat rods (3 in FIG. 2) and substrate no contact surface 602 towards the center of a supported substrate (not shown in FIG. 3). Substrate contact sub-finger 606 has a width "d" and a length "c" defining contact surface area of substrate contact sub-finger 606. Boat finger 600 further includes a substrate no contact region 608 around substrate contact sub-finger 606. The substrate no contact region 608 is a void space around substrate contact sub-finger 606 that is bounded by the broken line 610 in FIG. 6. The broken line 610 reflects an imaginary boundary defined by the length "b" of finger 600 and a width "a" of the substrate no-contact surface 602. Substrate no contact region 608 has a width equal to "a" and a length equal to "c". The area of substrate no contact region 608 is defined by its width and its length less the area of finger 600 occupied by substrate contact surface 604 on substrate contact sub-finger 606. In accordance with the embodiment of FIG. 6, the combined surface area of the substrate contact surface 604 is less than a sum of the area of the substrate no contact region 608 and the surface area of the substrate contact surface 604.

Referring to FIG. 7, a top plan view of a boat finger 700 in accordance with an embodiment of the present disclosure is illustrated. Boat finger 700 includes a topside surface (15 in FIG. 2) and an underside surface (17 in FIG. 2). In FIG. 7, finger 700 includes a width "a" and a length "b". Topside surface in FIG. 7 includes a substrate no contact surface 702, a substrate contact surface 704 and a substrate no contact region 708. Substrate no contact surface 702 corresponds to those portions on the finger 700 that do not contact an underside of substrate 121 (see FIG. 2). In FIG. 7, the substrate no contact surface 702 has a width "a" and a length equal to the difference between "b" and "c" (length of substrate contact surface 704). Boat finger 700 in FIG. 7 further includes a substrate contact sub-finger 706 which has a triangular shape, i.e., an isosceles triangle shape, and includes a similarly shaped substrate contact surface 704 on its topside. Substrate contact sub-finger 706 extends away from boat rods (3 in FIG. 2) and substrate no contact surface 702 towards the center of a supported substrate (not shown in FIG. 3). Substrate contact sub-finger 706 has a width at its base that is less than "a" and a length that is equal to "c". Boat finger 700 further includes a substrate no contact region 708 around substrate contact sub-finger 706. The substrate no contact region 708 is a void space around substrate contact sub-finger 706 that is bounded by the broken line 710 in FIG. 7. The broken line 710 reflects an imaginary boundary defined by the length "b" of finger 700 and a width "a" of the substrate no-contact surface 702. The area of substrate no contact region 708 is defined by its width and its length less the area of finger 700 occupied by substrate contact surface 704 on substrate contact sub-finger 706. In accordance with the embodiment of FIG. 7, the surface area of the substrate contact surface 704 is less than a sum of the area of the substrate no contact region 708 and the surface area of the substrate contact surface 704.

Referring to FIG. 8, a top plan view of a boat finger 800 in accordance an embodiment of the present disclosure is illustrated. Boat finger 800 includes a topside surface (15 in FIG. 2) and an underside surface (17 in FIG. 2). In FIG. 8, finger 800 includes a width "a" and a length "b". Topside surface in FIG. 8 includes a substrate no contact surface 802, a substrate contact surface 804 and a plurality of substrate no contact regions 708, e.g., perforations 708 passing through finger 800 from the topside surface to the underside surface. Substrate no contact surface 802 corresponds to those portions on the finger 800 that do not contact an underside of substrate 121 (see FIG. 2). In FIG. 8, the substrate no contact surface 802 has a width "a" and a length equal to the difference between "b" and "c" (length of substrate contact surface 704). Boat finger 800 in FIG. 8 further includes a substrate contact sub-finger 806 which has a generally rectangular shape with corners of its distal end being rounded. Substrate contact sub-finger 806 includes a similarly shaped substrate contact surface 804 on its topside. Substrate contact sub-finger 806 extends away from boat rods (3 in FIG. 2) and substrate no contact surface 802 towards the center of a supported substrate (not shown in FIG. 3). Substrate contact sub-finger 806 has a width at its base that equal to "a" and a length that is equal to "c". Boat finger 800 further includes a plurality of substrate no contact regions 808 in the form of perforations that extend through the substrate contact sub-finger 806 for the topsides surface to the underside surface. The substrate no contact regions 808 are void spaces passing through substrate contact sub-finger 806. The area of substrate no contact regions 808 is defined by the diameter of the round perforations. In accordance with the embodiment of FIG. 8, the surface area of the substrate contact surface 804 is less than a sum of the area of the substrate no contact regions 808 and the surface area of the substrate contact surface 804. While the substrate no contact regions 808 are illustrated as being round perforations in FIG. 8, substrate no contact regions 808 are not limited to round perforations. In other embodiments, the perforations can be different shapes, such as ovals or polygons.

In accordance with some embodiments of the present disclosure, dimension "a" is 13-19 mm, dimension "b" is 15-19 mm, dimension "c" is 3-9 mm, dimension d is 3-9 mm, and angle Θ is 30 to 90 degrees. Embodiments of the present disclosure are not limited to the foregoing dimensions or angles. Other embodiments of the present disclosure include dimensions that fall outside the above ranges and angles that fall outside of the above range.

In one embodiment of the present disclosure, a method for processing a substrate includes supporting a substrate having a front side in a backside in a substrate boat. The substrate boat includes a top plate, a bottom plate and a plurality of boat rods extending between the top plate in the bottom plate. Each of the plurality of boat rods includes a finger that includes an underside, a substrate contact surface and a substrate no contact region. The substrate contact surface contacts an underside of a substrate supported by the substrate boat. The substrate no contact region is overlapped by the substrate located in the substrate boat. In one embodiment, a surface area of the substrate contact surface is less than the sum of an area of the substrate no contact region and the surface area of the substrate contact surface. The method further includes a step of forming a film on the backside of the substrate and patterning a front side of the substrate. In accordance with some embodiments of the present disclosure, contact of the finger and the backside of the substrate does not cause the thickness of the film formed on the backside of the substrate to be so thin that when the substrate is subjected to subsequent patterning of the front side of the substrate the "boat print" formed on the backside of the substrate (due to the contact between the finger and the underside of the substrate) causes anomalies to form in the front side surface of the substrate due to forces exerted on the backside of the substrate during the subsequent patterning process.

In another embodiment of the present disclosure, a substrate boat is provided that includes a top plate, a bottom plate in a plurality of boat rods extending between the top plate in the bottom plate. Each of the plurality of boat rods includes a finger that includes an underside, a substrate contact surface which contacts an underside of a substrate within the boat and a substrate no contact region overlapped by the substrate. In accordance with this embodiment, a surface area of the substrate contact surface is less than the sum of an area of the substrate no contact region and the surface area of the substrate contact surface.

In another embodiment of the present disclosure, a thermal processing system is provided that includes a substrate boat as described above.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A substrate boat, comprising:
a top plate;
a bottom plate; and
a plurality of boat rods extending between the top plate and the bottom plate, each of the plurality of boat rods including at least one finger, the at least one finger including:
a first portion that includes a first end adjacent the respective boat rod, the first portion extends inward toward a center of the substrate boat from the respective boat rod, the first portion including a second end opposite the first end, and the first portion of the finger comprising a no-contact top surface which, in operation, does not contact a backside of a substrate;
a plurality of second portions that each extends inward toward the center of the substrate boat from the second end of the first portion, the plurality of second portions comprising respective planar substrate contact surfaces, which, in operation, contact the backside of the substrate; and
one or more substrate no-contact regions, each of the one or more substrate no-contact regions comprising a void space located laterally between adjacent ones of the second portions, in operation, the one or more substrate no-contact regions are overlapped by the substrate.

2. The substrate boat of claim 1, wherein the finger further an underside surface that, in operation, does not contact the substrate.

3. The substrate boat of claim 1, wherein the finger of each of the plurality of boat rods lie in a common horizontal plane.

4. The substrate boat of claim 3, wherein each of the plurality of boat rods includes a plurality of fingers.

5. The substrate boat of claim 1, wherein the finger includes three or more second portions.

6. The substrate boat of claim 5, wherein each of the three or more second portions have a rectangular shape.

7. The substrate boat of claim 1, wherein the finger includes two second portions, each of the two second portions occupying a common horizontal plane and including a longitudinal axis separated from each other by an angle between 30 degrees and 90 degrees.

8. The substrate boat of claim 1, wherein a surface area of the plurality of substrate contact surfaces is less than the sum of an area of the one or more substrate no-contact regions and the surface area of the plurality of substrate contact surfaces.

9. The substrate boat of claim 1, wherein the finger includes one or more perforation passing from an underside surface to the substrate contact surface.

10. A substrate boat, comprising:
a top plate;
a bottom plate; and
a plurality of boat rods extending between the top plate and the bottom plate, each of the plurality of boat rods including a finger, the finger including:
a first portion that includes a first end adjacent the respective boat rod, the first portion extends inward toward a center of the substrate boat from the respective boat rod, the first portion including a second end opposite the first end, and the first portion of the finger comprising a no-contact top surface which, in operation, does not contact a backside of a substrate;
a plurality of second portions that each extends inward toward the center of the substrate boat from the second end of the first portion, the plurality of second portions comprising respective substrate contact surfaces, which, in operation, contact the backside of the substrate; and
a substrate no-contact region comprising a void space located laterally between adjacent ones of the plurality of second portions, in operation, the substrate no-contact region is overlapped by the substrate.

11. The substrate boat of claim 10, wherein the finger includes two second portions, each of the two second portions lying in a common horizontal plane and including a longitudinal axis separated from each other by an angle between 30 degrees and 90 degrees.

12. The substrate boat of claim 10, wherein the plurality of substrate contact surfaces are triangular in shape.

13. The substrate boat of claim 10, wherein the finger includes one or more perforations extending between the backside and the plurality of substrate contact surfaces.

14. The substrate boat of claim 10, wherein the plurality of substrate contact surfaces are rectangular in shape.

15. The substrate boat of claim 10, wherein the finger further comprises an underside surface that, in operation, does not contact the substrate.

16. The substrate boat of claim 10, wherein each of the plurality of boat rods includes a plurality of fingers.

17. The substrate boat of claim 10, wherein the finger includes three or more second portions.

18. The substrate boat of claim 10, wherein a surface area of the plurality of substrate contact surfaces is less than the sum of an area of the substrate no-contact region and the surface area of the plurality of substrate contact surfaces.

19. A substrate boat, comprising:
a plurality of boat rods extending between a top plate and a bottom plate, each of the plurality of boat rods including a finger, the finger including:
a first portion that includes a first end adjacent the respective boat rod, the first portion extends inward toward a center of the substrate boat from the respective boat rod, the first portion including a second end opposite the first end, and the first portion of the finger comprising a no-contact top surface which, in operation, does not contact a backside of a substrate;
a plurality of second portions that each extends inward toward the center of the substrate boat from the second end of the first portion, the plurality of second portions comprising respective substrate contact surfaces, which, in operation, contact the backside of the substrate;

one or more substrate no-contact regions, each of the one or more substrate no-contact regions comprising a void space located laterally between adjacent ones of the plurality of substrate contact surfaces; and one or more perforations passing from an underside surface to the substrate contact surfaces, wherein a surface area of the plurality of substrate contact surfaces is less than the sum of an area of the one or more substrate no-contact regions and the surface area of the plurality of substrate contact surfaces.

20. The substrate boat of claim 19, wherein the plurality of substrate contact surfaces have a rectangular shape.

\* \* \* \* \*